(12) United States Patent
Wang (10) Patent No.: US 12,001,106 B2
(45) Date of Patent: Jun. 4, 2024

(54) ARRAY SUBSTRATE AND LIQUID CRYSTAL DISPLAY PANEL

(71) Applicant: WUHAN CHINA STAR OPTOELECTRONICS TECHNOLOGY CO., LTD., Hubei (CN)

(72) Inventor: Lifang Wang, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/597,944

(22) PCT Filed: Jan. 11, 2022

(86) PCT No.: PCT/CN2022/071274
§ 371 (c)(1),
(2) Date: Jul. 13, 2023

(87) PCT Pub. No.: WO2023/130486
PCT Pub. Date: Jul. 13, 2023

(65) Prior Publication Data
US 2024/0036413 A1    Feb. 1, 2024

(30) Foreign Application Priority Data
Jan. 7, 2022 (CN) .......................... 202210012253.5

(51) Int. Cl.
G02F 1/1362    (2006.01)
(52) U.S. Cl.
CPC .. *G02F 1/136286* (2013.01); *G02F 1/136222* (2021.01); *G02F 1/136227* (2013.01)

(58) Field of Classification Search
CPC ....................... G02F 1/13685; G02F 1/136222
See application file for complete search history.

(56) References Cited

U.S. PATENT DOCUMENTS

| | | | |
|---|---|---|---|
| 2004/0027505 A1* | 2/2004 | Yamazaki | G02F 1/1345 349/43 |
| 2009/0212290 A1 | 8/2009 | Youn et al. | |
| 2015/0168759 A1 | 6/2015 | Amano | |

FOREIGN PATENT DOCUMENTS

| | | |
|---|---|---|
| CN | 101404134 A | 4/2009 |
| CN | 102496618 A | 6/2012 |

(Continued)

OTHER PUBLICATIONS

International Search Report in International application No. PCT/CN2022/071274, dated Jun. 28, 2022.

(Continued)

*Primary Examiner* — James A Dudek
(74) *Attorney, Agent, or Firm* — PV IP PC; Wei Te Chung; Zhigang Ma (57) ABSTRACT

An array substrate and a liquid crystal display panel are provided. By arranging scan lines on a second metal layer in the array substrate, a width of a channel of a thin-film transistor is not related to a width of a scan line, so that the width of the scan line can be increased to reduce resistance of the scan line. In addition, the impedance of the second metal layer is relatively small, so that the impedance of the scan line can be reduced. Furthermore, a channel width of the thin-film transistor is relatively small, which improves charging efficiency of the array substrate and reduces the distortion difference of scan signals.

20 Claims, 5 Drawing Sheets

(56) References Cited

FOREIGN PATENT DOCUMENTS

| | | |
|---|---|---|
| CN | 102576173 A | 7/2012 |
| CN | 103034002 A | 4/2013 |
| CN | 103646966 A | 3/2014 |
| CN | 103728802 A | 4/2014 |
| CN | 104319279 A | 1/2015 |
| CN | 104409462 A | 3/2015 |
| CN | 104599651 A | 5/2015 |
| CN | 105070727 A | 11/2015 |
| CN | 105677111 A | 6/2016 |
| CN | 105807523 A | 7/2016 |
| CN | 107134461 A | 9/2017 |
| CN | 111341814 A | 6/2020 |
| CN | 112068368 A | 12/2020 |
| CN | 113097234 A | 7/2021 |
| CN | 213878094 U | 8/2021 |
| CN | 113391485 A | 9/2021 |
| JP | 2001281704 A | 10/2001 |
| JP | 2003045966 A | 2/2003 |
| KR | 20060038076 A | 5/2006 |
| KR | 20160133059 A | 11/2016 |

OTHER PUBLICATIONS

Written Opinion of the International Search Authority in International application No. PCT/CN2022/071274 , dated Jun. 28, 2022.

Chinese Office Action issued in corresponding Chinese Patent Application No. 202210012253.5 dated Apr. 23, 2023, pp. 1-8.

Chinese Notice of Allowance issued in corresponding Chinese Patent Application No. 202210012253.5 dated May 24, 2023, pp. 1-4.

Japanese Office Action issued in corresponding Japanese Patent Application No. 特願 2022-510120 dated Apr. 16, 2024, pp. 1-4.

\* cited by examiner

ARRAY SUBSTRATE AND LIQUID CRYSTAL DISPLAY PANEL

BACKGROUND OF INVENTION

1. Field of Invention

The present application relates to a technical field of displays, and particularly to an array substrate and a liquid crystal display panel.

2. Related Art

With development of vehicle panel technology, size of vehicle panels is getting larger and larger. In driving process of current panels, circuits are configured on both sides to input signals to scan lines. However, since gate layers are generally formed of molybdenum, resistance is relatively large. As the size of the vehicle panels increases, the lateral voltage drop of the panels will be extremely serious. As a result, delay differences in different areas of the panels are large, and display uniformity of the panels is poor. In order to solve this problem, in current display devices, an interval time between the staging of each row will be increased, which will shorten the charging time of each row and reduce charging rates. Alternatively, a way of increasing number of output terminals and driver chip data is adopted. But this design gives rise to a larger space occupation and cannot meet the demand. Furthermore, in order to alleviate a leakage problem, channels of devices will be made smaller, which will further increase the distortion of scan signals.

Therefore, current display devices have a technical problem of distortion of scan signals caused by the relatively large impedance of gate layers.

SUMMARY OF INVENTION

An object of the present application is to provide an array substrate and a liquid crystal display panel to alleviate a technical problem of distortion of scan signals caused by the relatively large impedance of gate layers of current display devices.

To overcome the above-mentioned problem, the present application provides a technical solution as follows:

An embodiment of the present application provides an array substrate, including a substrate; an active layer disposed on a side of the substrate; a gate insulating layer disposed on a side of the active layer away from the substrate; a first metal layer disposed on the side of the active layer away from the substrate and formed into a gate electrode; an interlayer dielectric layer disposed on a side of the first metal layer away from the gate insulating layer; a second metal layer disposed on a side of the interlayer dielectric layer away from the first metal layer and comprising a source electrode, a drain electrode, and a scan line. The array substrate further includes a data line including a first part included in the first metal layer and a second part included in the second metal layer. At a junction of the scan line and the data line, the second part of the data line is connected to the first part of the data line through the interlayer dielectric layer, and the scan line is connected to the gate electrode through the interlayer dielectric layer.

In some embodiments, the active layer has an active pattern, a projection of the active pattern on the substrate is located on a side of a projection of the scan line on the substrate, and the projection of the active pattern on the substrate does not overlap the projection of the scan line on the substrate.

In some embodiments, the active pattern includes a channel region and a doped region, wherein the channel region of the active pattern is arranged in a horizontal direction.

In some embodiments, the scan line includes a notch located on a side close to the drain electrode, a width of part of the scan line with respect to where the drain electrode is connected to the active pattern is less than a width of part of the scan line with respect to where the source electrode is connected to the active pattern.

In some embodiments, in the doped region, a distance between part of the active pattern on a side where the source electrode is connected to the active pattern and the scan line is greater than a distance between part of the active pattern on a side where the drain electrode is connected to the active pattern and the scan line.

In some embodiments, the active pattern includes a channel region and a doped region, wherein a projection of the channel region of the active pattern on the substrate overlaps a projection of the scan line is connected to the gate electrode of the gate electrode on the substrate, wherein the source electrode and the drain electrode are connected to the active pattern through the interlayer dielectric layer and the gate insulating layer in the doped region.

In some embodiments, the gate electrode includes a first gate portion and a second gate portion, wherein a projection of the first gate portion on the substrate is located within a projection of the scan line on the substrate, a width of the first gate portion is less than a width of the scan line, and a projection of the second gate portion on the substrate overlaps a projection of the active pattern on the substrate.

In some embodiments, at least a via hole is defined in the interlayer dielectric layer in an area corresponding to the first gate portion, and the first gate portion is connected to the scan line through the via hole.

In some embodiments, the at least a via hole includes a first via hole and a second via hole, and the first gate portion is connected to the scan line through the first via hole and the second via hole.

In some embodiments, the second gate portion includes a first switch part and a second switch part, the first switch part and the second switch part are connected to the first gate portion, and the first switch part and the second switch part are insulated from each other.

An embodiment of the present application further provides a liquid crystal display panel, including an array substrate, a color filter substrate, and a liquid crystal layer disposed between the array substrate and the color filter substrate, the array substrate including a substrate; an active layer disposed on one side of the substrate; a gate insulating layer disposed on a side of the active layer away from the substrate; a first metal layer disposed on the side of the active layer away from the substrate and formed into a gate electrode; an interlayer dielectric layer disposed on a side of the first metal layer away from the gate insulating layer; a second metal layer disposed on a side of the interlayer dielectric layer away from the first metal layer and comprising a source electrode, a drain electrode, and a scan line. The array substrate further includes a data line including a first part included in the first metal layer and a second part included in the second metal layer. At a junction of the scan line and the data line, the second part of the data line is connected to the first part of the data line through the interlayer dielectric layer, and the scan line is connected to the gate electrode through the interlayer dielectric layer.

In some embodiments, the active layer has an active pattern, a projection of the active pattern on the substrate is located on a side of a projection of the scan line on the substrate, and the projection of the active pattern on the substrate does not overlap the projection of the scan line on the substrate.

In some embodiments, the active pattern includes a channel region and a doped region, wherein the channel region of the active pattern is arranged in a horizontal direction.

In some embodiments, in the doped region, a distance between part of the active pattern on a side where the source electrode is connected to the active pattern and the scan line is greater than a distance between part of the active pattern on a side where the drain electrode is connected to the active pattern and the scan line.

In some embodiments, the active pattern includes a channel region and a doped region, wherein a projection of the channel region of the active pattern on the substrate overlaps a projection of the gate electrode on the substrate, wherein the source electrode and the drain electrode are connected to the active pattern through the interlayer dielectric layer and the gate insulating layer in the doped region.

In some embodiments, the gate electrode includes a first gate portion and a second gate portion, wherein a projection of the first gate portion on the substrate is located within a projection of the scan line on the substrate, a width of the first gate portion is less than a width of the scan line, and a projection of the second gate portion on the substrate overlaps a projection of the active pattern on the substrate.

In some embodiments, at least a via hole is defined in the interlayer dielectric layer in an area corresponding to the first gate portion, and the first gate portion is connected to the scan line through the via hole.

In some embodiments, the at least a via hole includes a first via hole and a second via hole, and the first gate portion is connected to the scan line through the first via hole and the second via hole.

In some embodiments, the second gate portion includes a first switch part and a second switch part, the first switch part and the second switch part are connected to the first gate portion, and the first switch part and the second switch part are insulated from each other.

In some embodiments, the first part of the data line includes a first terminal, a first connection line, and a second terminal, and the second part of the data line includes a second connection line, a third terminal, and a fourth terminal, wherein both ends of the first connection line are connected to the first terminal and the second terminal, the third terminal is connected to the second connection line, the first terminal and the third terminal are connected through a via hole of the interlayer dielectric layer, the fourth terminal is connected with the second connection line, and the second terminal and the fourth terminal are connected through the via hole of the interlayer dielectric layer, wherein a projection area of the third terminal on the substrate is larger than or equal to a projected area of the first terminal on the substrate, and a projection area of the fourth terminal on the substrate is larger than or equal to a projection area of the second terminal on the substrate.

The present application has advantageous effects as follows: the present application provides the array substrate and the liquid crystal display panel. The array substrate includes the substrate, the active layer, the gate insulating layer, the first metal layer, the interlayer dielectric layer, and the second metal layer. The active layer is disposed on one side of the substrate, the gate insulating layer is disposed on a side of the active layer away from the substrate, the first metal layer is disposed on the side of the active layer away from the substrate and is formed into a gate electrode. The interlayer dielectric layer is disposed on a side of the first metal layer away from the gate insulating layer, and the second metal layer is disposed on a side of the interlayer dielectric layer away from the first metal layer and includes the source electrode, the drain electrode, and the scan line. The array substrate further includes the data line having the first part disposed in the first metal layer and the second part disposed in the second metal layer. At a junction of the scan line and the data line, the second part of the data line is connected to the first part of the data line through the interlayer dielectric layer, and the gate electrode is connected to the scan line through the interlayer dielectric layer. By arranging scan lines in the second metal layer in the array substrate of the present application, when disposing channels of thin-film transistors, a width of a channel of each thin-film transistor is not related to a width of the scan line. Therefore, the width of the scan line can be increased to reduce resistance of the scan line. Furthermore, the scan line is formed by a second metal layer whose impedance is lesser than that of the first metal layer, which further reduces the impedance of the scan line, and can make the channel width of the thin-film transistor lesser, and improve charging efficiency of the array substrate, as well as reducing the distortion difference of scan signals.

BRIEF DESCRIPTION OF DRAWINGS

The technical solutions and other advantageous effects of the present application will be apparent through the detailed description of the specific embodiments of the present application in conjunction with the accompanying drawings.

DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

Figure 1:
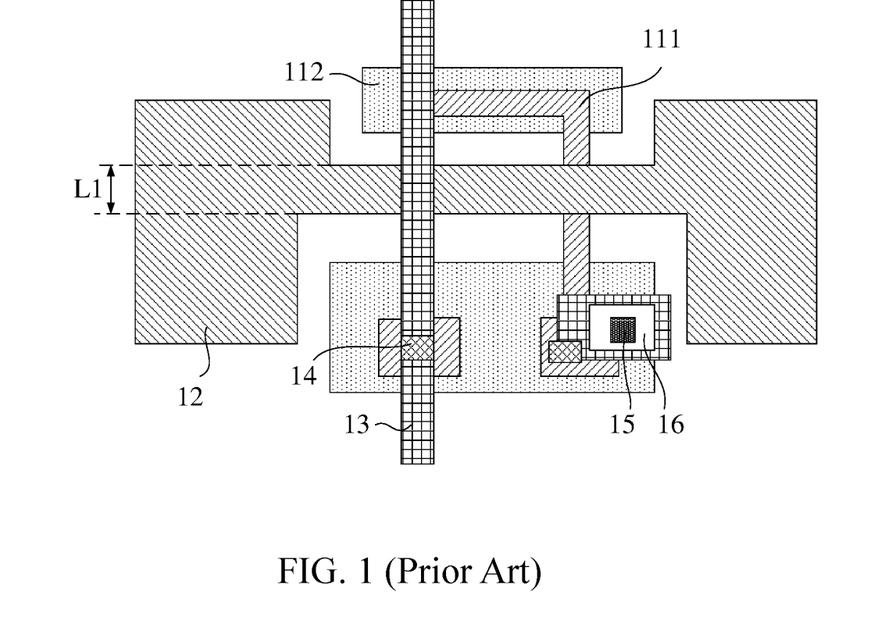
FIG. 1 is a schematic view of a conventional liquid crystal display device.

As shown in FIG. 1, in order to reduce a leakage problem of current display devices, a structure with dual gate electrodes and an n-shaped active pattern is provided. The display device includes an active layer, a gate layer 12, a source and drain layer 13. The active layer includes polysilicon 111 and dopant ions 112 for doping of polysilicon 111. The source and drain layers 13 are connected to the active layer through via holes of an interlayer dielectric layer. Specifically, reference numeral 14 represents a connection between source and drain electrodes and the active pattern, reference numeral 15 represents a connection between the source and drain electrodes and a pixel electrode, and reference numeral 16 represents a via hole for a planarization layer and a passivation layer. In order to improve charging rates of pixels and reduce coupling capacitance of scan lines, as can be seen from FIG. 1, a channel length scan L1 of a thin-film transistor will be designed to be smaller, the length of the channel is also a width of the scan line, and the smaller channel length gives rise to a smaller width of the scan line. According to a resistance formula, the smaller the width of the scan line is, the larger the impedance is, resulting in a greater voltage drop of the scan line and distortion of the scan signal.

Figure 2:
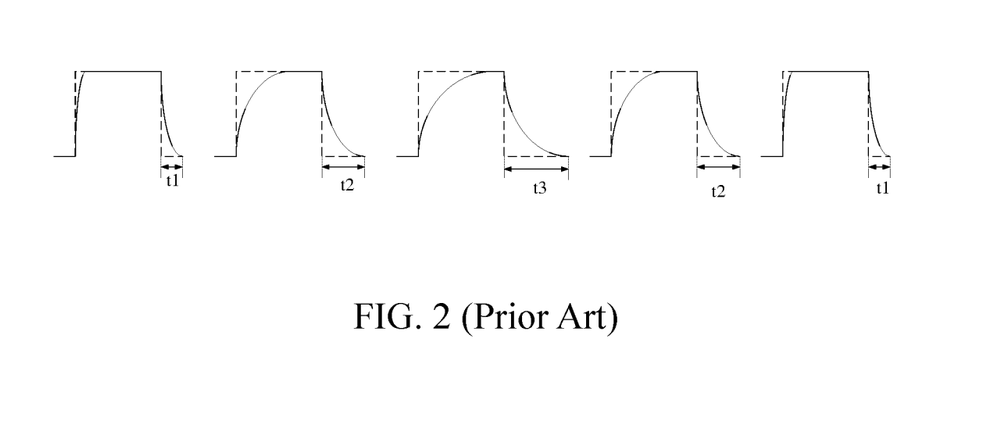
FIG. 2 is a waveform view of scan signals from two sides to a middle area of a conventional liquid crystal display device.

Specifically, compared with a small-sized display device in which a horizontal length is lesser than a vertical length, for a medium and large-sized display device, the horizontal length is much greater than the vertical length. However, gate on array (GOA) circuits are arranged on left and right sides of the display device, the scan lines are horizontally connected to the GOA circuits on both sides, and data lines are arranged vertically, resulting in an excessive length of the scan lines. From the resistance formula, it can be known that the greater the length of the scan line is, the greater the resistance is, resulting in extremely serious lateral voltage drop of a display panel. As shown in FIG. 2, taking the GOA circuit arranged on both sides of the display device as an example, it can be seen from a left side of the display device to a middle area, and from a right side of the display device to the middle area, a waveform of a specific scan signal indicates t1 is lesser than t2, and t2 is lesser than t3. Due to the voltage drop of the scan line, the scan signal is seriously distorted from the both sides to the middle area. When the display device is displayed, it will cause a significant difference in delay in different areas of the panel and display uniformity of the display device is poor. In addition, in order to prevent a mischarge caused by the delay, an interval time between the staging of each row is increased, which results in a decrease in a charging time of each row, and reduces a charging rate. Alternatively, a way of increasing number of output terminals and driver chip data is adopted. But this design will result in a larger space occupation and cannot meet the demand. Therefore, current display devices have a technical problem of distortion of scan signals caused by the relatively large impedance of gate layers.

Figure 3:
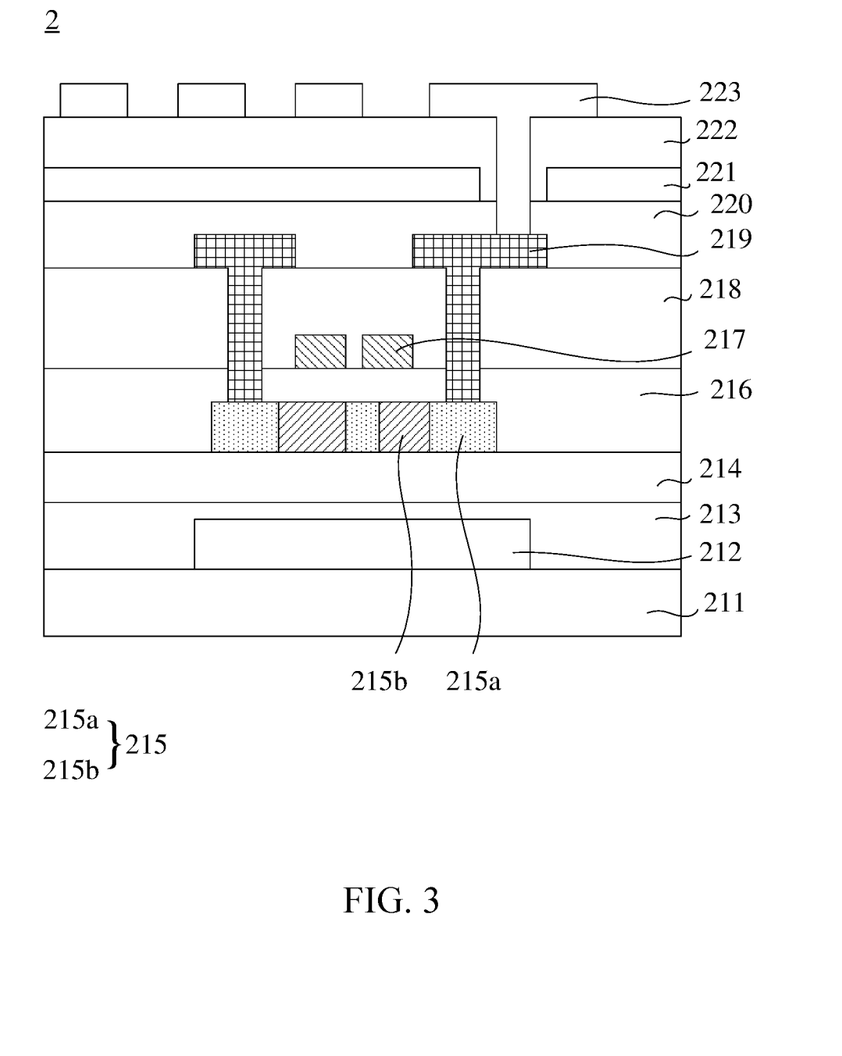
FIG. 3 is a first schematic view of an array substrate provided by an embodiment of the present application.
Figure 4:
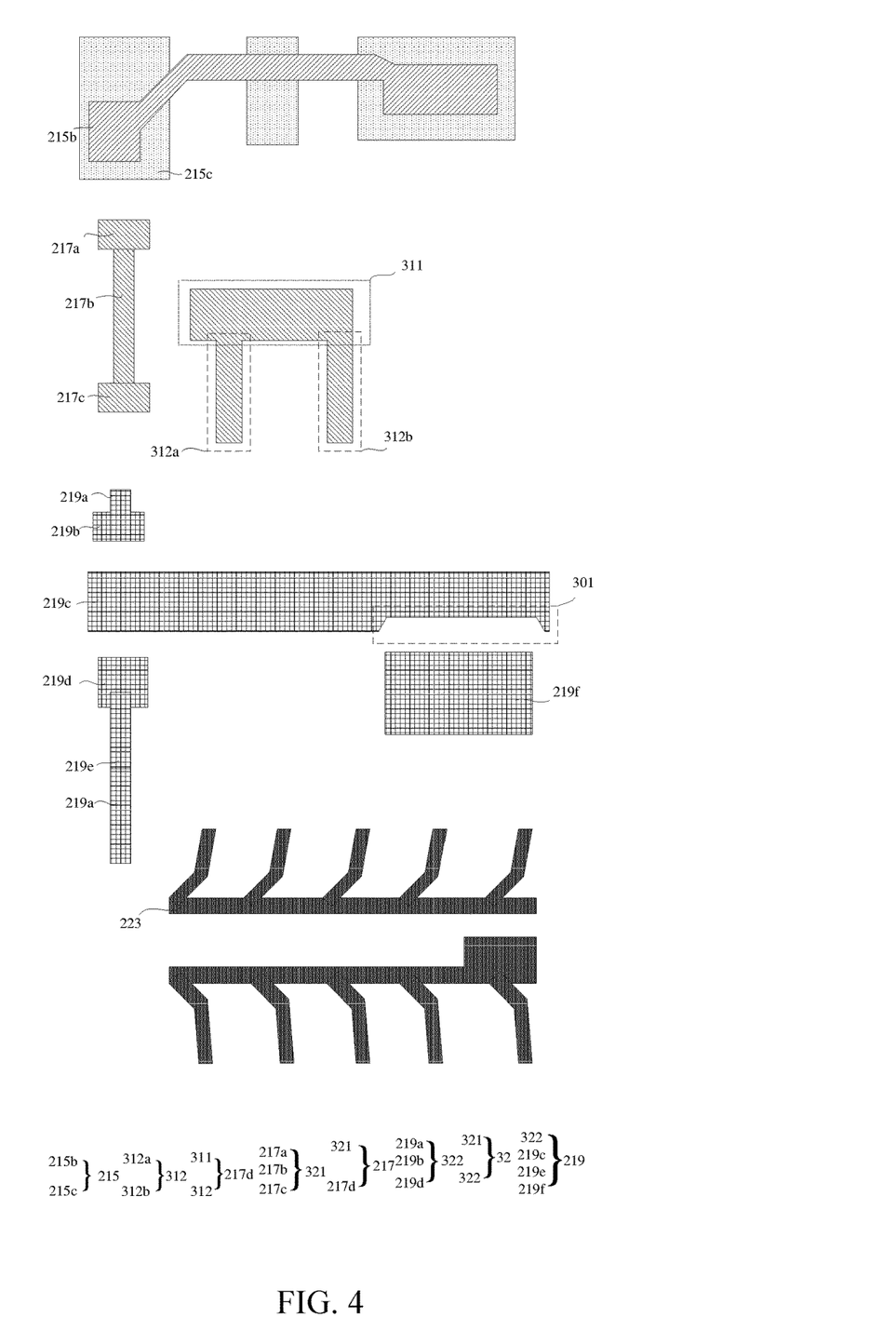
FIG. 4 is a second schematic view of an array substrate provided by an embodiment of the present application.
Figure 5:
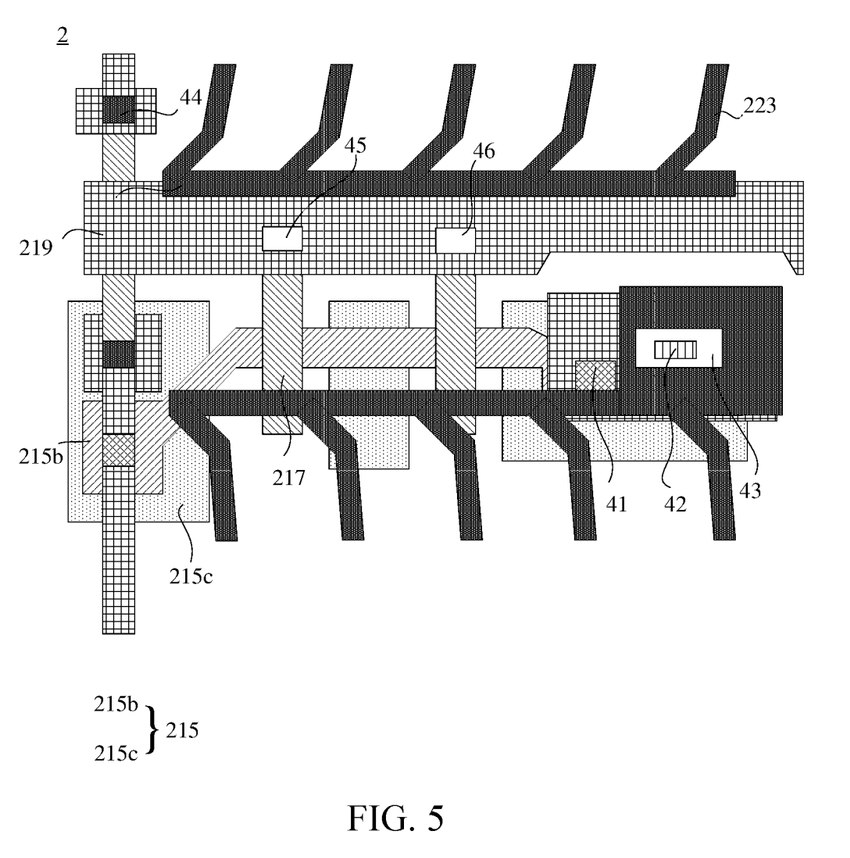
FIG. 5 is a third schematic view of an array substrate provided by an embodiment of the present application.

As shown in FIGS. 3, 4, and 5, an embodiment of the present application provides an array substrate. The array substrate 2 includes a substrate 211; an active layer 215 disposed on one side of the substrate 211; a gate insulating layer 216 disposed on a side of the active layer 215 away from the substrate 211; a first metal layer 217 disposed on the side of the active layer 215 away from the substrate 211 and is formed into a gate electrode 217d; an interlayer dielectric layer 218 disposed on a side of the first metal layer 217 away from the gate insulating layer 216; a second metal layer 219 disposed on a side of the interlayer dielectric layer 218 away from the first metal layer 217 and including a source electrode 219e, a drain electrode 219f, and a scan line 219c; wherein the array substrate 2 further includes a data line 32. The data line 32 has a first part 321 included in the first metal layer 127 and a second part 322 included in the second metal layer 219. At a junction of the scan line 219c and the data line 32, the second part 322 of the data line 32 is connected to the first part 321 of the data line 32 through the interlayer dielectric layer 218, and the scan line 219c is connected to the gate electrode 217d through the interlayer dielectric layer 218.

Embodiments of the present application provide an array substrate. By arranging scan lines in the second metal layer in the array substrate, when disposing channels of thin-film transistors, a width of a channel of each thin-film transistor is not related to a width of the scan line. Therefore, the width of the scan line can be increased to reduce resistance of the scan line. Furthermore, the scan line is formed by a second metal layer whose impedance is lesser than that of the first metal layer, which further reduces the impedance of the scan line, and can make the channel width of the thin-film transistor lesser, and improve charging efficiency of the array substrate, as well as reducing the distortion difference of scan signals.

It should be noted that, in FIG. 5, each film layer or device in the array substrate is superimposed, so that a structure of some of film layers is blocked. The specific structure of each film layer is schematically illustrated by an exploded view in FIG. 4, and the arrangement and connection relationship between each film layer are described in detail in the following examples.

The correlation between the channel length of the thin-film transistor and the width of the scan line leads to a smaller width of the scan line, thereby leading to a problem that the impedance of the scan line is relatively large. In one embodiment, as shown in FIGS. 3 to 5, the active layer 215 includes an active pattern. A projection of the active pattern on the substrate 211 is located on a side of a projection of the scan line 219c on the substrate 211, and the projection of the active pattern on the substrate 211 does not overlap the projection of the scan line 219c on the substrate 211. By disposing the scan line and the gate electrode separately, a line width of the scan line is not related to the channel length of the thin-film transistor. For the channel length of the thin-film transistor needs to be set smaller to improve the charging rate and reduce coupling capacitance, the channel length of the thin-film transistor can be designed without affecting the width of the scan line. Correspondingly, the line width of the scan line can be increased, so that the impedance of the scan line is reduced. Therefore, while reducing the impedance of the scan line, the charging rate of a pixel is improved. In addition, the coupling capacitance of the scan line can be reduced according to the design of the scan line and the data line.

In one embodiment, the active pattern includes a channel region and a doped region, wherein the channel region of the active pattern is arranged in a horizontal direction. Compared with a conventional display device requiring an active pattern to be configured into n-line shape to reduce the width of the scan line, in the embodiment of the present application, the channel length of the thin-film transistor is not related to the line width of the scan line, so the active pattern can be set horizontally, the line width of the scan line can be increased, and the voltage drop of the scan line can be reduced.

It should be noted that, in FIG. 3, the part of the active pattern in the channel region is denoted by reference numeral 215b, and the part of the active pattern in the doped region is denoted by reference numeral 215a. In FIGS. 4 and 5, a doped material of the active pattern is denoted by reference numeral 215c, and an undoped active pattern is denoted by reference numeral 215b. Therefore, the channel region and the doped region of the active pattern can be obtained by the doped material and the undoped active.

It should be noted that, in order to facilitate the description of the design of each film layer and the connection of each film layer, and for ease understanding of the overlapping state of each film layer, a lightly doped region is not shown in the drawings of the embodiments of the present application. Unless otherwise specified in the drawings and descriptions in the embodiments of the present application, the doped region refers to a heavily doped region. However, in actual design, there will be the lightly doped region, and the lightly doped region is disposed between the heavily doped region and the channel region, which will not be repeated in the following embodiments.

Specifically, as shown in FIGS. 3 to 5, the doped region 215a includes a first doped region, a second doped region, and a third doped region which are arranged in sequence. The channel region 215b includes a first channel region and a second channel region, the first channel region is located between the first doped region and the second doped region, and the second channel region is located between the second doped region and the third doped region. By disposing the doped region and the channel region horizontally, the channel length of the thin-film transistor is not related to the line width of the scan line, the line width of the scan line is increased, and the voltage drop of the scan line is reduced.

Specifically, as shown in FIGS. 1 and 5, compared with a conventional display device requiring an active pattern to be configured into n-like shape to reduce the width of the scan line, in the embodiment of the present application, the channel length of the thin-film transistor is not related to the line width of the scan line, so the active pattern can be set horizontally, the doped region and the channel region can be arranged horizontally in sequence, and the doped region in a middle can improve conductivity of the active pattern, thereby reducing power consumption, increasing the line width of the scan line, and reducing the voltage drop of the scan line.

In one embodiment, as shown in FIG. 3 to FIG. 5, a notch 301 is formed on a side of the scan line 219c close to the drain electrode 219f. A width of part of the scan line 219c with respect to where the drain electrode 219f is connected to the active pattern is less than a width of part of the scan line 219c with respect to where the source electrode 219e is connected to the active pattern. By forming the notch on the scan line on the side where the drain electrode is connected to the pixel electrode, there is a certain distance between the scan line and the drain electrode to prevent a short circuit between the drain electrode and the scan line, as well as formation of parasitic capacitance between the scan line and the pixel electrode, which adversely affects the normal display of the display device.

In one embodiment, as shown in FIGS. 3 to 5, in the doped region, a distance between part of the active pattern on a side where the source electrode 219e is connected to the active pattern and the scan line 219c is greater than a distance between part of the active pattern on a side where the drain electrode 219f is connected to the active pattern and the scan line 219c. By setting the distance between part of the active pattern on a side where the source electrode is connected to the active pattern and the scan line to be greater than a distance between part of the active pattern on a side where the drain electrode is connected to the active pattern and the scan line, when the source electrode is connected to the data line, an area where the data line is connected from the second metal layer to the first metal layer can be reserved, so as to prevent the first metal layer from being connected to the active layer when the data line is connected from the second metal layer to the first metal layer, or to prevent a short circuit with the scan line, which adversely affects the normal display.

Specifically, the above embodiments are described in detail by taking the connection between the source electrode and the data line, and the data line implementing the routing arrangement of the first metal layer and the second metal layer on a side of the source electrode as an example, but the embodiments of the present application are not limited thereto. Similarly, when the data line is located on a side of the drain electrode to connect the first metal layer and the second metal layer, a distance between part of the active pattern on a side of the drain electrode and the scan line is greater than a distance between part of the active pattern on the side of the source electrode and the scan line.

In one embodiment, the active pattern includes a channel region and a doped region. In the channel region, a projection of the active pattern on the substrate overlaps a projection of the gate electrode on the substrate. In the doped region, the source electrode and the drain electrode are connected to the active pattern through the interlayer dielectric layer and the gate insulating layer. By overlapping the projection of the gate electrode and the active pattern on the substrate in the channel region, a switching function of the gate electrode of the thin-film transistor of the array substrate is achieved; by connecting the source electrode and the drain electrode with the doped region of the active pattern, a signal transmission function of the thin-film transistor of the array substrate is achieved, so that when an electrical signal is input, the transmission of the signal can be controlled by the thin-film transistor.

A technical problem of larger impedance of scan lines is caused by conventional display devices configured with thin-film transistors having reduced channel lengths to ensure charging rates of pixels and to reduce coupling capacitance of the scan lines. In one embodiment, as shown in FIGS. 3 to 5, the gate electrode 217d includes a first gate portion 311 and a second gate portion 312. A projection of the first gate portion 311 on the substrate 211 is within a projection of the scan line 219c on the substrate 211, and a width of the first gate portion 311 is less than a width of the scan line 219c. The projection of the second gate portion 312 on the substrate 211 overlaps the projection of the active pattern on the substrate 211. By dividing the gate electrode into the first gate portion and the second gate portion, since the gate electrode and the scan line are located in different layers, the width of the scan line cannot be affected by the gate electrode, so that the width of the scan line is greater than the width of the first gate portion, thereby reducing the impedance of the scan line and the voltage drop of the scan line and achieving a switching function of the first gate portion and the second gate portion.

In one embodiment, the gate electrode includes a first gate portion and a second gate portion. A projection of the first gate portion on the substrate is within a projection of the scan line on the substrate, and a width of the first gate portion is equal to a width of the scan line. The projection of the second gate portion on the substrate overlaps the projection of the active pattern on the substrate. Based on the projection of the first gate portion on the substrate is within the projection of the scan line on the substrate, and the width of the first gate portion is equal to a width of the scan line, while the width of the scan line is increased to reduce the impedance of the scan line, an area of the gate electrode can also be increased to improve the connection stability between the gate electrode and the scan line, as well as reducing the impedance at a juncture of the gate electrode and the scan line. Furthermore, since an increased portion of the gate electrode does not exceed the width of the scan line, it does not increase the size of the pixel.

In one embodiment, at least a via hole is defined in the interlayer dielectric layer in an area corresponding to the first gate portion, and the first gate portion is connected to the scan line through the via hole. By making the first gate portion overlap the scan line, the gate electrode and the scan line can be directly connected through an overlapping portion between the gate electrode and the scan line. That is, the via hole is formed in the interlayer dielectric layer in an area corresponding to the overlapping portion between the first gate portion and the scan line, so that the first gate portion is connected to the scan line, thereby achieving a switch function of the thin-film transistor under the control of turning on and turning off of the gate electrode through a signal transmitted by the scan line.

In an embodiment, as shown in FIGS. 4 and 5, the via holes include a first via hole 45 and the second via hole 46. The first gate portion 311 is connected to the scan line 219*c* through the first via hole 45 and the second via hole 46. By connecting the first gate portion with the scan line in multiple places, the connectivity between the gate electrode and the scan line is better, and the efficiency and stability of signal transmission are improved.

Specifically, the above embodiments are described in detail by taking an example that the via holes formed by the interlayer dielectric layer include the first via hole and the second via hole, but the embodiments of the present application are not limited thereto. For example, in order to further increase the connectivity between the gate electrode and the scan line, a third via hole can be provided, so that the first gate portion of the gate electrode and the scan line are connected through the first via hole, the second via hole, and the third via hole. In addition, when the connectivity between the gate electrode and the scan line needs to be further improved, the number of the via hole can be further increased to enhance the connectivity between the gate electrode and the scan line.

The embodiment below is provided to solve a leakage problem in the display device. In one embodiment, as shown in FIGS. 3 to 5, the second gate portion 312 includes a first switch part 312*a* and a second switch part 312*b*. The first switch part 312*a* and the second switch part 312*b* are connected to the first gate portion 311, and the first switch part 312*a* and the second switch part 312*b* are insulated from each other. By arranging the first switch part and the second switch part, the projections of the first switch part and the second switch part and the channel region of the active pattern overlap, and the gate electrode is designed as a dual gate, thereby reducing the leakage problem of the array substrate.

Specifically, as shown in FIGS. 4 and 5, FIG. 4 is an exploded view of the active layer 215, the first metal layer 217, and the second metal layer 219, and FIG. 5 is a top plan view of each film layer of the array substrate. It can be seen from FIGS. 4 and 5 that the active layer 215 includes an undoped active pattern and a doped material 215*c* of the active pattern. The first metal layer 217 includes the first part 321 of the data line 32 and the gate electrode 217*d*, the second metal layer 219 includes the second part 322 of the data line 32, the source electrode 219*e*, the drain electrode 219*f*, and the scan line 219*c*. As shown in FIG. 5, since the data line 32 and the scan line 219*c* intersect each other, the data line 32 is therefore formed using the first metal layer 217 in an intersection area between the data line 32 and the scan line 219*c*.

Specifically, the first part 321 of the data line 32 includes a first terminal 217*a*, a first connection line 217*b*, and a second terminal 217*c*; the second part 322 of the data line 32 includes the second connection line 219*a*, the third terminal 219*b*, and the fourth terminal 219*d*. The first terminal 217*a* and the third terminal 219*b* are connected through via holes in the interlayer dielectric layer, and the second terminal 217*c* and the fourth terminal 219*d* are connected through the via holes in the interlayer dielectric layer; specifically, in FIG. 5, reference numeral 44 denotes a connecting portion of the first terminal and the third terminal, and a connecting portion of the second terminal and the fourth terminal. In FIG. 5, the third terminal covers the first terminal, and the fourth terminal covers the second terminal. Therefore, the first terminal and the second terminal are not shown in FIG. 5.

Specifically, the source electrode 219*e* and the drain electrode 219*f* are connected to the active pattern through the via holes of the interlayer dielectric layer and the gate insulating layer. As shown in FIG. 5, reference numeral 41 denotes a portion where the source electrode and the drain electrode are connected to the active layer.

Specifically, in order to facilitate the display of the superimposed state of each film layer, some film layers are not shown in FIG. 5. In FIG. 5, reference numeral 43 denotes the via hole formed by the planarization layer and the passivation layer, and reference numeral 42 denotes a connecting portion of the drain electrode and the pixel electrode.

It can be seen from FIGS. 4 and 5 that when a scan signal is input, the scan signal will be transmitted from the scan line 219*c* of the second metal layer, and then transmitted to the gate electrode 217*d* through the first and second via holes 45 and 46 of the scan line 219*c* and the gate electrode 217*d*, so that the gate electrode 217*d* is turned on. When a data signal is input to the data line, the data signal will be transmitted from the second connection line 219*a* of the data line 32 of the second metal layer to the third terminal 219*b*, then transmitted from the third terminal 219*b* to the first terminal 217*a*, then from the first terminal 217*a* to the first connection line 217*b*, then from the first connection line 217*b* to the second terminal 217*c*, then from the second terminal 217*c* to the fourth terminal 219*d*, then from the fourth terminal 219*d* to the second connection line 219*a*, and then from the second connection line 219*a* to the source electrode 219*e* to input the data signal. In this process, since the scan signal is routed through the second metal layer, and the line width of the scan line can be increased, the delay of the scan signal is reduced.

It should be noted that, in the above embodiments, the exploded view and top plate view of each film layer shown in FIGS. 4 and 5 are used for detailed description, but the embodiments of the present application are not limited thereto. For example, any feature in FIGS. 4 and 5 can be applied in other embodiments, and is not limited to the embodiments corresponding to FIGS. 4 and 5.

Specifically, in one embodiment, the first part of the data line includes a first terminal, a first connection line, and a second terminal, and the second part of the data line includes a second connection line, a third terminal, and a fourth terminal, wherein both ends of the first connection line are connected to the first terminal and the second terminal, the third terminal is connected to the second connection line, the first terminal and the third terminal are connected through a via hole of the interlayer dielectric layer, the fourth terminal is connected with the second connection line, and the second terminal and the fourth terminal are connected through the via hole of the interlayer dielectric layer. A projection area of the third terminal on the substrate is larger than or equal to a projected area of the first terminal on the substrate, and a projection area of the fourth terminal on the substrate is larger than or equal to a projection area of the second terminal on the substrate. Based on the projection area of the third terminal on the substrate is larger than or equal to a projected area of the first terminal on the substrate, and the projection area of the fourth terminal on the substrate is larger than or equal to a projection area of the second terminal on the substrate, when the first part of the data line and the second part of the data line are connected through the first terminal, the second terminal, the third terminal, and the fourth terminal, the first terminal and the second terminal can be connected with the third terminal and the fourth terminal on the whole surface, so as to improve the connection effect and reduce the impedance.

In one embodiment, a resistance per unit area of the first metal layer is less than a resistance per unit area of the second metal layer. In the array substrate, a resistance of a material of the second metal layer is less than a resistance of a material of the first metal layer. By using the second metal layer to form the scan line, when a signal is input, the voltage drop of the scan line is relatively less, and the problem of signal distortion is reduced.

In one embodiment, the scan lines of pixels located in a same row are integrally formed. When forming the pixels of the same row, the scan lines of the pixels can be formed at the same time, so that the scan lines of the pixels of the same row are all formed by the second metal layer, thereby reducing the delay of the scan signal from both sides to a middle area.

In one embodiment, as shown in FIG. 3, the array substrate 2 further includes a light shielding layer 212, a barrier layer 213, and a buffer layer 214. The light shielding layer 212 is correspondingly disposed in a disposition area of the active layer 215.

In one embodiment, as shown in FIG. 3, the array substrate 2 further includes a planarization layer 220, a first electrode layer 221, a passivation layer 222, and a second electrode layer 223. The source and drain layer 219 is connected to the second electrode layer 223 through the via holes of the planarization layer 220 and the passivation layer 222.

As shown in FIG. 3, both sides of the first electrode layer 221 are disconnected in FIG. 3, but in practice, in order to insulate the first electrode layer and the second electrode layer, via holes are formed in the first electrode layer. The passivation layer is filled into the via holes to separate the first electrode layer and the second electrode layer, and the second electrode layer is connected to the source and drain layer through the passivation layer and the planarization layer. The first electrode layer is provided on an entire surface, but only the via holes are formed, instead of being provided in multiple sections.

Figure 6:
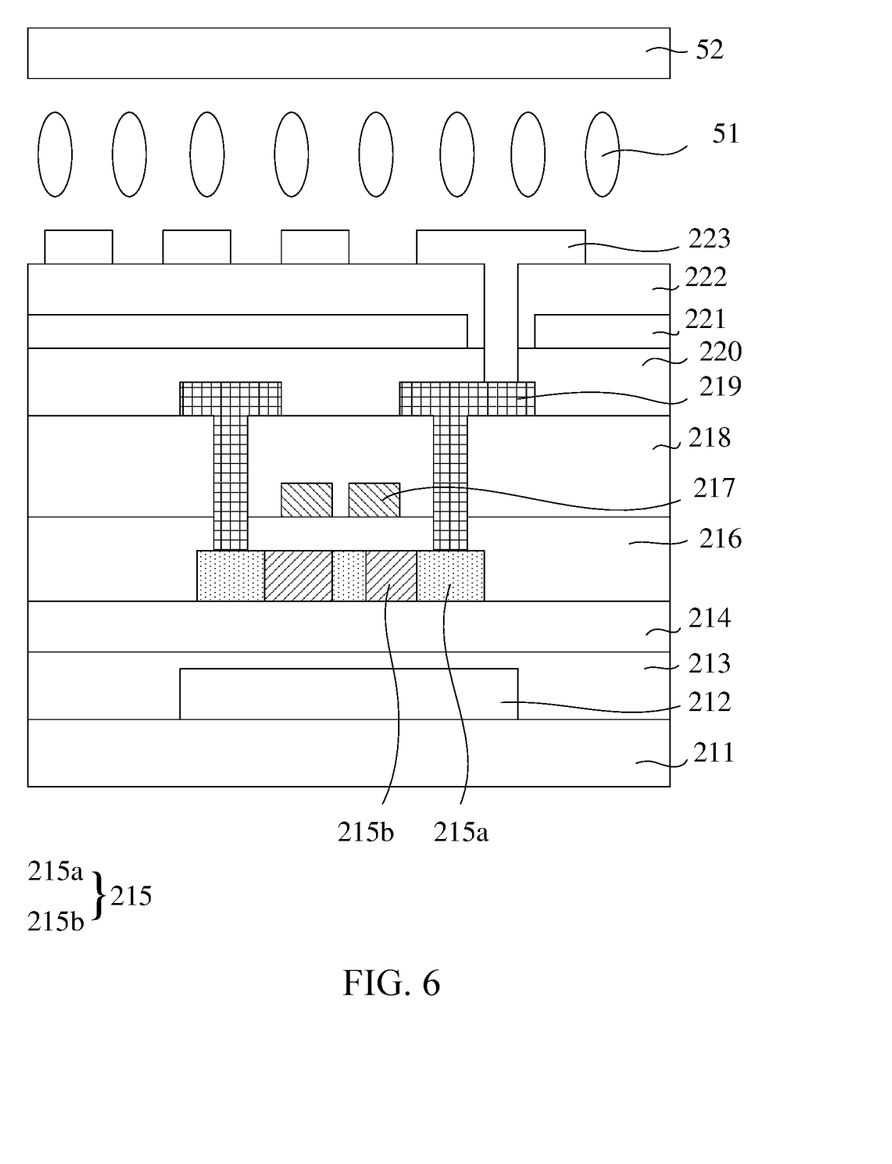
FIG. 6 is a schematic view of a liquid crystal display panel provided by an embodiment of the present application.

Furthermore, as shown in FIGS. 4 to 6, an embodiment of this application provides a liquid crystal display panel, including an array substrate, a color filter substrate 52, and a liquid crystal layer 51 disposed between the array substrate and the color filter substrate 52. The array substrate includes a substrate 211; an active layer 215 disposed on one side of the substrate 211; a gate insulating layer 216 disposed on a side of the active layer 215 away from the substrate 211; a first metal layer 217 disposed on the side of the active layer 215 away from the substrate 211 and formed into a gate electrode 217d; an interlayer dielectric layer 218 disposed on a side of the first metal layer 217 away from the gate insulating layer 216; and a second metal layer 219 disposed on a side of the interlayer dielectric layer 218 away from the first metal layer 217 and including a source electrode 219e, a drain electrode 219f, and a scan line 219c.

The array substrate 2 further includes a data line 32 including a first part 321 included in the first metal layer 217 and a second part 322 included in the second metal layer 219, wherein at a junction of the scan line 219c and the data line 32, the second part 322 of the data line 32 is connected to the first part 321 of the data line 32 through the interlayer dielectric layer 218, and the scan line 219c is connected to the gate electrode 217d through the interlayer dielectric layer 218.

Embodiments of the present application provide a liquid crystal display panel, including an array substrate, a color filter substrate, and a liquid crystal layer disposed between the array substrate and the color filter substrate. By arranging scan lines in the second metal layer in the array substrate, when disposing channels of thin-film transistors, a width of a channel of each thin-film transistor is not related to a width of the scan line. Therefore, the width of the scan line can be increased to reduce resistance of the scan line. Furthermore, the scan line is formed by a second metal layer whose impedance is lesser than that of the first metal layer, which further reduces the impedance of the scan line, and can make the channel width of the thin-film transistor lesser, and improve charging efficiency of the array substrate, as well as reducing the distortion difference of scan signals.

In one embodiment, in the liquid crystal display panel, the active layer has an active pattern, a projection of the active pattern on the substrate is located on a side of a projection of the scan line on the substrate, and the projection of the active pattern on the substrate does not overlap the projection of the scan line on the substrate.

In one embodiment, in the liquid crystal display panel, the active pattern includes a channel region and a doped region, wherein the channel region of the active pattern is arranged in a horizontal direction.

In one embodiment, in the liquid crystal display panel, in the doped region, a distance between part of the active pattern on a side where the source electrode is connected to the active pattern and the scan line is greater than a distance between part of the active pattern on a side where the drain electrode is connected to the active pattern and the scan line.

In one embodiment, in the liquid crystal display panel, the active pattern includes a channel region and a doped region, wherein a projection of the channel region of the active pattern on the substrate overlaps a projection of the gate electrode on the substrate, wherein the source electrode and the drain electrode are connected to the active pattern through the interlayer dielectric layer and the gate insulating layer in the doped region.

In one embodiment, in the liquid crystal display panel, the gate electrode includes a first gate portion and a second gate portion, wherein a projection of the first gate portion on the substrate is located within a projection of the scan line on the substrate, a width of the first gate portion is less than a width of the scan line, and a projection of the second gate portion on the substrate overlaps a projection of the active pattern on the substrate.

In one embodiment, in the liquid crystal display panel, at least a via hole is defined in the interlayer dielectric layer in an area corresponding to the first gate portion, and the first gate portion is connected to the scan line through the via hole.

In one embodiment, in the liquid crystal display panel, the via hole includes a first via hole and a second via hole, and the first gate portion is connected to the scan line through the first via hole and the second via hole.

In one embodiment, in the liquid crystal display panel, the second gate portion includes a first switch part and a second switch part, the first switch part and the second switch part are connected to the first gate portion, and the first switch part and the second switch part are insulated from each other.

In one embodiment, in the liquid crystal display panel, the first part of the data line comprises a first terminal, a first connection line, and a second terminal, and the second part of the data line comprises a second connection line, a third terminal, and a fourth terminal, wherein both ends of the first connection line are connected to the first terminal and the second terminal, the third terminal is connected to the second connection line, the first terminal and the third terminal are connected through a via hole of the interlayer dielectric layer, the fourth terminal is connected with the second connection line, and the second terminal and the fourth terminal are connected through the via hole of the interlayer dielectric layer, wherein a projection area of the third terminal on the substrate is larger than or equal to a projected area of the first terminal on the substrate, and a projection area of the fourth terminal on the substrate is larger than or equal to a projection area of the second terminal on the substrate.

In one embodiment, in the liquid crystal display panel, a resistance per unit area of the first metal layer is less than a resistance per unit area of the second metal layer.

According to the above embodiments, it can be known that:

The embodiments of the present application provide an array substrate and a liquid crystal display panel. The array substrate includes a substrate, an active layer, a gate insulating layer, a first metal layer, an interlayer dielectric layer, and a second metal layer. The active layer is disposed on one side of the substrate, the gate insulating layer is disposed on a side of the active layer away from the substrate, the first metal layer is disposed on the side of the active layer away from the substrate, and a gate electrode is disposed in the first metal layer. The interlayer dielectric layer is disposed on a side of the first metal layer away from the gate insulating layer, and the second metal layer is disposed on a side of the interlayer dielectric layer away from the first metal layer and includes a source electrode, a drain electrode, and a scan line. Specifically, the array substrate further includes a data line having a first part included in the first metal layer and a second part included in the second metal layer. At a junction of the scan line and the data line, the second part of the data line is connected to the first part of the data line through the interlayer dielectric layer, and the gate electrode is connected to the scan line through the interlayer dielectric layer. By arranging scan lines in the second metal layer in the array substrate of the present application, when disposing channels of thin-film transistors, a width of a channel of each thin-film transistor is not related to a width of the scan line. Therefore, the width of the scan line can be increased to reduce resistance of the scan line. Furthermore, the scan line is formed by a second metal layer whose impedance is lesser than that of the first metal layer, which further reduces the impedance of the scan line, and can make the channel width of the thin-film transistor lesser, and improve charging efficiency of the array substrate, as well as reducing the distortion difference of scan signals.

In the above-mentioned embodiments, the description of each embodiment has its own emphasis. For parts that are not described in detail in an embodiment, reference may be made to related descriptions of other embodiments.

The array substrate and the liquid crystal display panel provided by the embodiments of the present application are described in detail above. The principles and implementations of the present application are described with specific examples herein. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. An array substrate, comprising:
   a substrate;
   an active layer disposed on a side of the substrate;
   a gate insulating layer disposed on a side of the active layer away from the substrate;
   a first metal layer disposed on the side of the active layer away from the substrate and formed into a gate electrode disposed;
   an interlayer dielectric layer disposed on a side of the first metal layer away from the gate insulating layer; and
   a second metal layer disposed on a side of the interlayer dielectric layer away from the first metal layer and comprising a source electrode, a drain electrode, and a scan line;
   wherein the array substrate further comprises a data line comprising a first part included in the first metal layer and a second part included in the second metal layer, wherein at a junction of the scan line and the data line, the second part of the data line is connected to the first part of the data line through the interlayer dielectric layer, and the scan line is connected to the gate electrode through the interlayer dielectric layer.

2. The array substrate of claim 1, wherein the active layer has an active pattern, a projection of the active pattern on the substrate is located on a side of a projection of the scan line on the substrate, and the projection of the active pattern on the substrate does not overlap the projection of the scan line on the substrate.

3. The array substrate of claim 2, wherein the active pattern comprises a channel region and a doped region, and the channel region of the active pattern is arranged in a horizontal direction.

4. The array substrate of claim 3, wherein the scan line comprises a notch located on a side close to the drain electrode, a width of part of the scan line with respect to where the drain electrode is connected to the active pattern is less than a width of part of the scan line with respect to where the source electrode is connected to the active pattern.

5. The array substrate of claim 3, wherein in the doped region, a distance between part of the active pattern on a side where the source electrode is connected to the active pattern and the scan line is greater than a distance between part of the active pattern on a side where the drain electrode is connected to the active pattern and the scan line.

6. The array substrate of claim 2, wherein the active pattern comprises a channel region and a doped region, wherein a projection of the channel region of the active pattern on the substrate overlaps a projection of the gate electrode on the substrate, wherein the source electrode and the drain electrode are connected to the active pattern through the interlayer dielectric layer and the gate insulating layer in the doped region.

7. The array substrate of claim 1, wherein the gate electrode comprises a first gate portion and a second gate portion, wherein a projection of the first gate portion on the substrate is located within a projection of the scan line on the substrate, a width of the first gate portion is less than a width of the scan line, and a projection of the second gate portion on the substrate overlaps a projection of the active pattern on the substrate.

8. The array substrate of claim 7, wherein at least a via hole is defined in the interlayer dielectric layer in an area corresponding to the first gate portion, and the first gate portion is connected to the scan line through the via hole.

9. The array substrate of claim 8, wherein the at least a via hole comprises a first via hole and a second via hole, and the first gate portion is connected to the scan line through the first via hole and the second via hole.

10. The array substrate of claim 7, wherein the second gate portion comprises a first switch part and a second switch part, the first switch part and the second switch part are connected to the first gate portion, and the first switch part and the second switch part are insulated from each other.

11. A liquid crystal display panel, comprising an array substrate, a color filter substrate, and a liquid crystal layer disposed between the array substrate and the color filter substrate, wherein the array substrate comprises:
 a substrate;
 an active layer disposed on a side of the substrate;
 a gate insulating layer disposed on a side of the active layer away from the substrate;
 a first metal layer disposed on the side of the active layer away from the substrate and formed into a gate electrode;
 an interlayer dielectric layer disposed on a side of the first metal layer away from the gate insulating layer; and
 a second metal layer disposed on a side of the interlayer dielectric layer away from the first metal layer and comprising a source electrode, a drain electrode, and a scan line;
 wherein the array substrate further comprises a data line comprising a first part included in the first metal layer and a second part included in the second metal layer, wherein at a junction of the scan line and the data line, the second part of the data line is connected to the first part of the data line through the interlayer dielectric layer, and the scan line is connected to the gate electrode through the interlayer dielectric layer.

12. The liquid crystal display panel of claim 11, wherein the active layer has an active pattern, a projection of the active pattern on the substrate is located on a side of a projection of the scan line on the substrate, and the projection of the active pattern on the substrate does not overlap the projection of the scan line on the substrate.

13. The liquid crystal display panel of claim 12, wherein the active pattern comprises a channel region and a doped region, and the channel region of the active pattern is arranged in a horizontal direction.

14. The liquid crystal display panel of claim 13, wherein in the doped region, a distance between part of the active pattern on a side where the source electrode is connected to the active pattern and the scan line is greater than a distance between part of the active pattern on a side where the drain electrode is connected to the active pattern and the scan line.

15. The liquid crystal display panel of claim 12, wherein the active pattern comprises a channel region and a doped region, wherein a projection of the channel region of the active pattern on the substrate overlaps a projection of the gate electrode on the substrate, wherein the source electrode and the drain electrode are connected to the active pattern through the interlayer dielectric layer and the gate insulating layer in the doped region.

16. The liquid crystal display panel of claim 11, wherein the gate electrode comprises a first gate portion and a second gate portion, wherein a projection of the first gate portion on the substrate is located within a projection of the scan line on the substrate, a width of the first gate portion is less than a width of the scan line, and a projection of the second gate portion on the substrate overlaps a projection of the active pattern on the substrate.

17. The liquid crystal display panel of claim 16, wherein at least a via hole is defined in the interlayer dielectric layer in an area corresponding to the first gate portion, and the first gate portion is connected to the scan line through the via hole.

18. The liquid crystal display panel of claim 17, wherein the at least a via hole comprises a first via hole and a second via hole, and the first gate portion is connected to the scan line through the first via hole and the second via hole.

19. The liquid crystal display panel of claim 16, wherein the second gate portion comprises a first switch part and a second switch part, the first switch part and the second switch part are connected to the first gate portion, and the first switch part and the second switch part are insulated from each other.

20. The liquid crystal display panel of claim 11, wherein the first part of the data line comprises a first terminal, a first connection line, and a second terminal, and the second part of the data line comprises a second connection line, a third terminal, and a fourth terminal, wherein both ends of the first connection line are connected to the first terminal and the second terminal, the third terminal is connected to the second connection line, the first terminal and the third terminal are connected through a via hole of the interlayer dielectric layer, the fourth terminal is connected with the second connection line, and the second terminal and the fourth terminal are connected through the via hole of the interlayer dielectric layer, wherein a projection area of the third terminal on the substrate is larger than or equal to a projected area of the first terminal on the substrate, and a projection area of the fourth terminal on the substrate is larger than or equal to a projection area of the second terminal on the substrate.

* * * * *